United States Patent
Scanlan et al.

(10) Patent No.: US 9,613,830 B2
(45) Date of Patent: Apr. 4, 2017

(54) FULLY MOLDED PERIPHERAL PACKAGE ON PACKAGE DEVICE

(71) Applicant: DECA Technologies Inc., Tempe, AZ (US)

(72) Inventors: Christopher M. Scanlan, Chandler, AZ (US); William Boyd Rogers, Raleigh, NC (US); Craig Bishop, Tucson, AZ (US)

(73) Assignee: Deca Technologies Inc., Tempe, AZ (US)

( * ) Notice: Subject to any disclaimer, the term of this patent is extended or adjusted under 35 U.S.C. 154(b) by 0 days.

(21) Appl. No.: 15/151,384

(22) Filed: May 10, 2016

(65) Prior Publication Data

US 2016/0260682 A1    Sep. 8, 2016

Related U.S. Application Data

(63) Continuation-in-part of application No. 14/930,514, filed on Nov. 2, 2015, which is a continuation-in-part
(Continued)

(51) Int. Cl.
*H01L 23/00* (2006.01)
*H01L 21/48* (2006.01)
(Continued)

(52) U.S. Cl.
CPC ........ *H01L 21/486* (2013.01); *H01L 21/4853* (2013.01); *H01L 21/52* (2013.01);
(Continued)

(58) Field of Classification Search
CPC ..... H01L 24/82; H01L 21/486; H01L 21/568; H01L 21/52; H01L 21/4583
(Continued)

(56) References Cited

U.S. PATENT DOCUMENTS

| 4,740,414 A | 4/1988 | Shasheen |
| 5,548,091 A | 8/1996 | DiStefano et al. |

(Continued)

FOREIGN PATENT DOCUMENTS

| JP | 3255970 A | 11/1991 |
| WO | WO2009006284 | 1/2009 |

(Continued)

OTHER PUBLICATIONS

Kwak, Hocheol and Hubing, Todd, An Overview of Advanced Electronic Packaging Technology, May 1, 2007.
(Continued)

*Primary Examiner* — Jerome Jackson, Jr.
*Assistant Examiner* — Bo Fan
(74) *Attorney, Agent, or Firm* — Booth Udall Fuller, PLC

(57) ABSTRACT

A method of making a semiconductor device can include providing a temporary carrier with a semiconductor die mounting site, and forming conductive interconnects over the temporary carrier in a periphery of the semiconductor die mounting site. A semiconductor die can be mounted at the semiconductor die mounting site. The conductive interconnects and semiconductor die can be encapsulated with mold compound. First ends of the conductive interconnects can be exposed. The temporary carrier can be removed to expose second ends of the conductive interconnects opposite the first ends of the conductive interconnects. The conductive interconnects can be etched to recess the second ends of the conductive interconnects with respect to the mold compound. The conductive interconnects can comprise a first portion, a second portion, and an etch stop layer disposed between the first portion and the second portion.

20 Claims, 7 Drawing Sheets

Related U.S. Application Data of application No. 14/642,531, filed on Mar. 9, 2015, now Pat. No. 9,177,926, which is a continuation-in-part of application No. 14/584,978, filed on Dec. 29, 2014, now Pat. No. 9,337,086, which is a continuation of application No. 14/024,928, filed on Sep. 12, 2013, now Pat. No. 8,922,021, which is a continuation of application No. 13/632,062, filed on Sep. 30, 2012, now Pat. No. 8,535,978, which is a continuation-in-part of application No. 13/341,654, filed on Dec. 30, 2011, now Pat. No. 8,604,600.

(60) Provisional application No. 62/258,308, filed on Nov. 20, 2015, provisional application No. 61/950,743, filed on Mar. 10, 2014, provisional application No. 61/672,860, filed on Jul. 18, 2012.

(51) Int. Cl.
| | |
|---|---|
| *H01L 21/52* | (2006.01) |
| *H01L 21/56* | (2006.01) |
| *H01L 21/78* | (2006.01) |
| *H01L 23/48* | (2006.01) |
| *H01L 21/768* | (2006.01) |
| *H01L 23/31* | (2006.01) |

(52) U.S. Cl.
CPC .......... *H01L 21/561* (2013.01); *H01L 21/568* (2013.01); *H01L 21/76838* (2013.01); *H01L 21/78* (2013.01); *H01L 23/48* (2013.01); *H01L 24/02* (2013.01); *H01L 24/05* (2013.01); *H01L 24/13* (2013.01); *H01L 24/19* (2013.01); *H01L 24/20* (2013.01); *H01L 24/92* (2013.01); *H01L 24/96* (2013.01); *H01L 24/97* (2013.01); *H01L 23/3114* (2013.01); *H01L 23/3128* (2013.01); *H01L 23/562* (2013.01); *H01L 24/03* (2013.01); *H01L 24/11* (2013.01); *H01L 24/94* (2013.01); *H01L 2224/0239* (2013.01); *H01L 2224/02311* (2013.01); *H01L 2224/02313* (2013.01); *H01L 2224/02331* (2013.01); *H01L 2224/02377* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04105* (2013.01); *H01L 2224/05008* (2013.01); *H01L 2224/05024* (2013.01); *H01L 2224/0558* (2013.01); *H01L 2224/05147* (2013.01); *H01L 2224/05166* (2013.01); *H01L 2224/05548* (2013.01); *H01L 2224/05568* (2013.01); *H01L 2224/05569* (2013.01); *H01L 2224/05572* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05687* (2013.01); *H01L 2224/1132* (2013.01); *H01L 2224/1145* (2013.01); *H01L 2224/11334* (2013.01); *H01L 2224/11452* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13024* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/2101* (2013.01); *H01L 2224/214* (2013.01); *H01L 2224/215* (2013.01); *H01L 2224/92* (2013.01); *H01L 2224/94* (2013.01); *H01L 2224/95001* (2013.01); *H01L 2224/96* (2013.01); *H01L 2924/12041* (2013.01); *H01L 2924/12042* (2013.01); *H01L 2924/13091* (2013.01); *H01L 2924/181* (2013.01); *H01L 2924/18161* (2013.01); *H01L 2924/18162* (2013.01); *H01L 2924/3511* (2013.01)

(58) Field of Classification Search
USPC .......... 257/737, 777, 793, 660, 686; 438/15
See application file for complete search history.

(56) References Cited

U.S. PATENT DOCUMENTS

| | | |
|---|---|---|
| 7,456,496 B2 | 11/2008 | Hwee et al. |
| 7,476,980 B2 | 1/2009 | Rebibis et al. |
| 7,482,203 B2 | 1/2009 | Song et al. |
| 7,550,857 B1 | 6/2009 | Longo et al. |
| 7,777,351 B1 | 8/2010 | Berry et al. |
| 7,829,380 B2 | 11/2010 | Irsigler et al. |
| 7,843,052 B1 | 11/2010 | Yoo et al. |
| 7,888,184 B2 | 2/2011 | Shim et al. |
| 8,030,770 B1 | 10/2011 | Juskey et al. |
| 8,237,259 B2 | 8/2012 | Pressel et al. |
| 8,288,209 B1 | 10/2012 | Chi et al. |
| 8,354,304 B2 | 1/2013 | Chow et al. |
| 8,436,255 B2 | 5/2013 | Goh |
| 8,487,435 B2 | 7/2013 | Juskey et al. |
| 8,653,674 B1 | 2/2014 | Darveaux et al. |
| 8,669,655 B2 | 3/2014 | Geitner et al. |
| 2003/0027373 A1 | 2/2003 | Distefano et al. |
| 2003/0092217 A1 | 5/2003 | Coyle |
| 2003/0164554 A1 | 9/2003 | Fee et al. |
| 2005/0208700 A1 | 9/2005 | Kwon et al. |
| 2006/0275949 A1 | 12/2006 | Farnworth et al. |
| 2006/0291029 A1 | 12/2006 | Lin et al. |
| 2008/0237828 A1 | 10/2008 | Yang |
| 2009/0302484 A1 | 12/2009 | Lee et al. |
| 2010/0052135 A1 | 3/2010 | Shim et al. |
| 2010/0167471 A1 | 7/2010 | Jin et al. |
| 2010/0195299 A1 | 8/2010 | Souriau et al. |
| 2010/0308474 A1 | 12/2010 | Shibuya et al. |
| 2011/0001215 A1 | 1/2011 | Lam |
| 2011/0042796 A1 | 2/2011 | Chang et al. |
| 2011/0095413 A1 | 4/2011 | Barth et al. |
| 2011/0156250 A1 | 6/2011 | Goh et al. |
| 2011/0186977 A1 | 8/2011 | Chi et al. |
| 2011/0193205 A1 | 8/2011 | Hsieh |
| 2011/0202896 A1 | 8/2011 | Scanlan et al. |
| 2011/0250396 A1 | 10/2011 | Matsutani et al. |
| 2011/0278741 A1* | 11/2011 | Chua ............... H01L 21/561 257/777 |
| 2012/0032314 A1 | 2/2012 | Chen et al. |
| 2012/0119373 A1 | 5/2012 | Hunt |
| 2012/0133001 A1 | 5/2012 | Tkaczyk et al. |
| 2013/0026658 A1 | 1/2013 | Chen |
| 2013/0062760 A1 | 3/2013 | Hung et al. |
| 2013/0168848 A1 | 7/2013 | Lin et al. |
| 2013/0168849 A1 | 7/2013 | Scanlan |
| 2013/0270682 A1 | 10/2013 | Hu et al. |
| 2013/0307140 A1 | 11/2013 | Huang et al. |
| 2013/0334698 A1 | 12/2013 | Mohammed et al. |
| 2014/0042600 A1 | 2/2014 | Kim et al. |

(56) References Cited

U.S. PATENT DOCUMENTS

2014/0054802 A1 2/2014 Shim
2014/0057394 A1 2/2014 Ramasamy et al.

FOREIGN PATENT DOCUMENTS

WO WO2009009436 1/2009
WO WO2010/080068 A1 7/2010

OTHER PUBLICATIONS

Kripesh, Vaidyanathan et al., Design and Development of a Multi-Die Embedded Micro Wafer Level Package, Institute of Microelectronics, Singapore, 2008.
Micronews, Fan-in WLCSP matures, what's next?, 3 D Packaging Magazine, Issue 14, Feb. 2008, pp. 2-5.
Th, E.K. et al, Encapsulation Challenges for Wafer Level Packaging, Electronics Packaging Technology Conference, 2009.
R Anderson, et al., Advances in WLCSP Technologies for Growing Market Needs, SMTA's 6th AMual International Wafer Level Packaging Conference, Oct. 27-30, 2009, Santa Clara, CA.
Kanth et al., Design and Development of True-CSP, United Test & Assembly Center Ltd (UTAC).
Hunt, John, Value Engineered Wafer Level Packages for Mobile Devices, Jul. 9, 2013.
Fan et al., Design and optimization of thermo-mechanical reliability in wafer level packaging, Jul. 4, 2009.
Motohashi et al., System in Wafer-Level Package Technology with RDL-first Process, Kanagawa, Japan.
Nishio, 3D package technologies review with gap analysis for mobile application requirements, STATS ChipPAC, Japan, Apr. 22, 2014.
Krohnert et al., System-in-package (SiP) on wafer level, enabled by fan-out WLP (eWLB), Portugal.
Flack et al., Lithography Technique to Reduce the Alignment Errors from Die Placement in Fan-out Wafer Level Packaging Applications, San Jose, CA.
Exposed, Merriam-Webster, merriam-webster.com/dictionary/exposed.
Thick Copper(Cu) RDL, Chipbond website.
Yannou, An overview of recent panel-scale packaging developments throughout the industry, MiNaPAD conference, Grenoble, Apr. 24, 2012.
WLCSP (FiWLP Technology), Wafer level chip scale package.

* cited by examiner

FULLY MOLDED PERIPHERAL PACKAGE ON PACKAGE DEVICE

CROSS-REFERENCE TO RELATED APPLICATIONS

This application claims the benefit, including the filing date, of U.S. Provisional Patent No. 62/258,308, entitled "Three-Dimensional Fully Molded Semiconductor Package," which was filed on Nov. 20, 2015, the disclosure of which is hereby incorporated herein by this reference. This application is also a continuation in part of U.S. patent application of U.S. application Ser. No. 14/930,514 entitled "Semiconductor Device and Method Comprising Redistribution Layers," which was filed on Nov. 2, 2015, which is a continuation in part of application Ser. No. 14/642,531 entitled "Semiconductor Device and Method Comprising Thickened Redistribution Layers," which was filed on Mar. 9, 2015, which application claims the benefit of U.S. Provisional Patent No. 61/950,743, entitled "Wafer-Level-Chip-Scale-Packages with Thick Redistribution Layer Traces," which was filed on Mar. 10, 2014, and further is also a continuation in part of U.S. application Ser. No. 14/584,978, entitled "Die Up Fully Molded Fan-Out Wafer Level Packaging," which was filed on Dec. 29, 2014, which application is a continuation of U.S. application Ser. No. 14/024,928, entitled "Die Up Fully Molded Fan-Out Wafer Level Packaging," which was filed on Sep. 12, 2013, now issued as U.S. Pat. No. 8,922,021, which application is a continuation of U.S. application Ser. No. 13/632,062, entitled "Die Up Fully Molded Fan-Out Wafer Level Packaging," which was filed on Sep. 30, 2012, now issued as U.S. Pat. No. 8,535,978, which application is a continuation in part of U.S. application Ser. No. 13/341,654, entitled "Fully Molded Fan-Out," which was filed on Dec. 30, 2011, now issued as U.S. Pat. No. 8,604,600, and claims the benefit of the filing date of U.S. Provisional Patent No. 61/672,860, entitled "Fan-Out Semiconductor Package," which was filed on Jul. 18, 2012, the disclosures of which are hereby incorporated herein by this reference.

TECHNICAL FIELD

The disclosure relates to a fully molded semiconductor package and method of making the same, which includes a peripheral area around a semiconductor die comprising vertically oriented electrical interconnects that facilitate of package on package (PoP) stacking of multiple semiconductor packages.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

On opportunity exists for improved semiconductor manufacturing. Accordingly, in an aspect, a method of making a semiconductor device can comprise providing a temporary carrier comprising a semiconductor die mounting site. A first portion of a conductive interconnect can be formed over the temporary carrier in a periphery of the semiconductor die mounting site. An etch stop layer can be formed over the first portion of the conductive interconnect. A second portion of the conductive interconnect can be formed over the etch stop layer and over the first portion of the conductive interconnect. A semiconductor die can be mounted at the semiconductor die mounting site. The conductive interconnect and semiconductor die can be encapsulated with a mold compound. A first end of the conductive interconnect can be exposed on the second portion of the conductive interconnect. A build-up interconnect structure can be formed to connect semiconductor die and the first ends of the conductive interconnect. The temporary carrier can be removed to expose a second end of the conductive interconnect on the second portion of the conductive interconnect opposite the first end of the conductive interconnect. The first portion of the conductive interconnect can be etched to expose the etch stop layer.

The method of making the semiconductor device can further comprise forming the etch stop layer of solder comprising a thickness in a range of 20-40 μm. The solder etch stop layer can be reflowed to form a bump after etching the first portion of the conductive interconnect to expose the etch stop layer. The etch stop layer can be formed as a solderable surface finish that remains over the second portion of the conductive interconnect when the second portion of the conductive interconnect is coupled to a conductive bump. The etch stop layer of a material that is not etched can be formed by a first etching chemistry that etches the first portion of the conductive interconnect, and the second portion of the conductive interconnect can be formed of a copper material that is not etched by a second etching chemistry that etches the etch stop layer.

The method of making the semiconductor device can further comprise forming a build-up interconnect structure to connect the semiconductor die and the first ends of the conductive interconnect. The first end of the conductive interconnect can be exposed with a first grinding process, and the second end of the conductive interconnect can be exposed with a second grinding process that removes the temporary carrier. The semiconductor die can be attached at the semiconductor die mounting site with a die attach film (DAF), and the DAF material can be exposed after removing the temporary carrier.

In another aspect, a method of making a semiconductor device can comprise providing a temporary carrier comprising a semiconductor die mounting site. Conductive interconnects can be formed over the temporary carrier in a periphery of the semiconductor die mounting site. A semiconductor die can be mounted at the semiconductor die mounting site. The conductive interconnects and semiconductor die can be encapsulated with mold compound. First ends of the conductive interconnects can be exposed. The temporary carrier can be removed to expose second ends of the conductive interconnects opposite the first ends of the conductive interconnects. The conductive interconnects can be etched to recess the second ends of the conductive interconnects with respect to the mold compound.

The method of making the semiconductor device can further comprise making each of the conductive interconnects comprising a first portion, a second portion, and an etch stop layer disposed between the first portion and the second portion. The etch stop layer can be formed of solder, and the solder etch stop layer can be reflowed to form a bump after etching the first portion of the conductive interconnects to expose the etch stop layer of each conductive interconnect. The etch stop layer can be formed as a surface finish that remains over the second portion of the conductive interconnects. The etch stop layer can be formed of a material that is not etched by a first etching chemistry that etches the first portion of the conductive interconnects, and the second portion of the conductive interconnects can be formed of a material that is not etched by a second etching chemistry that etches the etch stop layer. A build-up interconnect structure can be formed to connect the semiconductor die and the conductive interconnects. The first end of the conductive interconnects can be exposed with a first grinding process, and the second end of the conductive interconnects can be exposed with a second grinding process that removes the temporary carrier.

In another aspect, a method of making a semiconductor device can comprise providing a temporary carrier comprising a semiconductor die mounting site. Conductive interconnects can be formed over the temporary carrier in a periphery of the semiconductor die mounting site. A semiconductor die can be mounted at the semiconductor die mounting site. The conductive interconnects and semiconductor die can be encapsulated with mold compound. First ends of the conductive interconnects can be exposed. The temporary carrier can be removed to expose second ends of the conductive interconnects opposite the first ends of the conductive interconnects.

The method of making the semiconductor device can further comprise the conductive interconnects further comprising a first portion, a second portion, and an etch stop layer disposed between the first portion and the second portion. The etch stop layer can be formed of solder, and the solder etch stop layer can be reflowed to form a bump after etching the first portion of the conductive interconnects to expose the etch stop layer. The etch stop layer can be formed as a surface finish that remains over the second portion of the conductive interconnects. A build-up interconnect structure can be formed to connect the semiconductor die and the conductive interconnects. The first ends of the conductive interconnects can be exposed with a first grinding process, and the second ends of the conductive interconnects can be exposed with a second grinding process that removes the temporary carrier.

The foregoing and other aspects, features, and advantages will be apparent to those artisans of ordinary skill in the art from the DESCRIPTION and DRAWINGS, and from the CLAIMS.

DETAILED DESCRIPTION

Figure 1A:
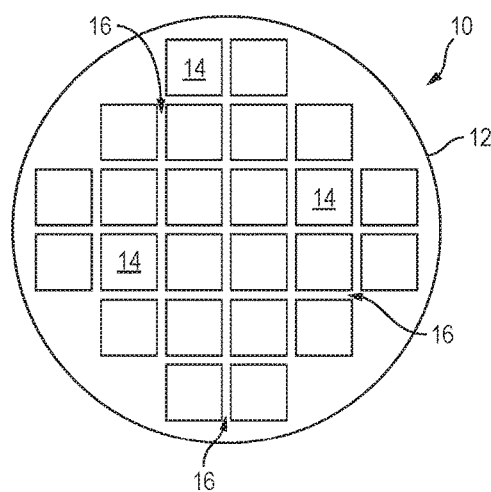
FIGS. 1A-1C illustrate semiconductor die from a native wafer comprising electrical interconnects.

The present disclosure includes one or more aspects or embodiments in the following description with reference to the figures, in which like numerals represent the same or similar elements. Those skilled in the art will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

This disclosure, its aspects and implementations, are not limited to the specific equipment, material types, or other system component examples, or methods disclosed herein. Many additional components, manufacturing and assembly procedures known in the art consistent with manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example," or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

The electrical system can be a stand-alone system that uses the semiconductor device to perform one or more electrical functions. Alternatively, the electrical system can be a subcomponent of a larger system. For example, the electrical system can be part of a cellular phone, personal digital assistant (PDA), digital video camera (DVC), or other electronic communication device. Alternatively, the electrical system can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

FIG. 1A shows a plan view of a semiconductor wafer or native wafer 10 with a base substrate material 12, such as, without limitation, silicon, germanium, gallium arsenide, indium phosphide, or silicon carbide, for structural support. A plurality of semiconductor die or components 14 can be formed on wafer 10 separated by a non-active, inter-die wafer area or saw street 16 as described above. The saw street 16 can provide cutting areas to singulate the semiconductor wafer 10 into the individual semiconductor die 14.

Figure 1B:
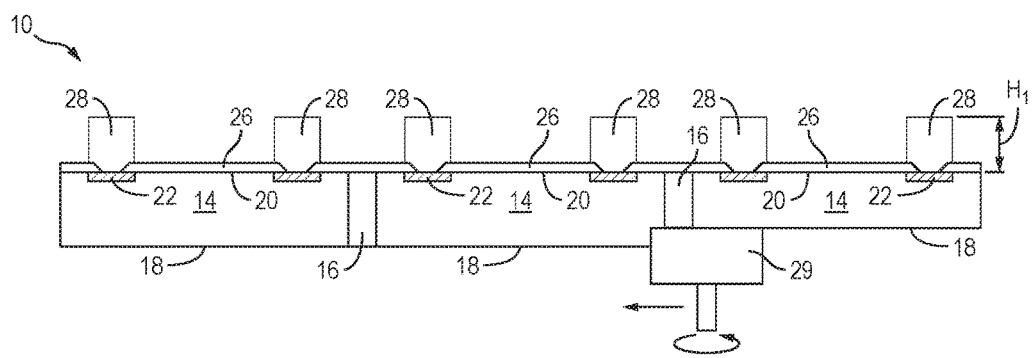

FIG. 1B shows a cross-sectional profile view of a plurality of semiconductor die 14 from the native wafer 10, shown in FIG. 1A. Each semiconductor die 14 has a backside or back surface 18 and an active surface 20 opposite the backside 18. Active surface 20 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 20 to implement analog circuits or digital circuits, such as DSP, ASIC, memory, or other signal processing circuits. Semiconductor die 14 may also contain IPDs such as inductors, capacitors, and resistors, for RF signal processing.

An electrically conductive layer 22 is formed over active surface 20 using PVD, CVD, electrolytic plating, electroless plating process, or other suitable metal deposition process. Conductive layer 22 can be one or more layers of aluminum (Al), copper (Cu), Sn, nickel (Ni), gold (Au), silver (Ag), or other suitable electrically conductive material. Conductive layer 22 can be, or operate as, contact pads or bond pads electrically coupled or connected to the circuits on active surface 20. Conductive layer 22 can be formed as contact pads disposed side-by-side a first distance from the edge of semiconductor die 14, as shown in FIG. 1B. Conductive layer 22 can also be formed as contact pads that are offset in multiple rows such that a first row of contact pads is disposed a first distance from the edge of the die, and a second row of contact pads alternating with the first row is disposed a second distance from the edge of the die. Additionally, conductive layer 22 can be formed as contact pads that are arranged as a full array of pads distributed over the active area of the semiconductor die or chip. In some instances the contact pads can be arranged in an irregular or asymmetrical array with differing or various spacing among the contact pads.

FIG. 1B also shows an optional insulating or passivation layer 26 conformally applied over active surface 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 14 are packaged without the use of any PBO layers, and insulating layer 26 can be formed of a different material or omitted entirely. In another embodiment, insulating layer 26 includes a passivation layer formed over active surface 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 1B also shows conductive bumps, conductive interconnects, or electrical interconnect structures 28 that can be formed as columns, pillars, posts, thick RDLs, bumps, or studs that are formed of copper or other suitable conductive material, which are disposed over, and coupled or connected to, conductive layer 22. Conductive bumps 28 can be formed directly on conductive layer 22 using patterning and metal deposition processes such as printing, PVD, CVD, sputtering, electrolytic plating, electroless plating, metal evaporation, metal sputtering, or other suitable metal deposition process. Conductive bumps 28 can be one or more layers of Al, Cu, Sn, Ni, Au, Ag, palladium (Pd), or other suitable electrically conductive material and can include one or more layers. In some instances, one or more UBM layers of Al, Cu, Sn, Ni, Au, Ag, Pd, or other suitable electrically conductive material can optionally be disposed between conductive layer 22 and conductive bumps 28. In some embodiments, conductive bumps 28 can be formed by depositing a photoresist layer over the semiconductor die 14 and conductive layer 22 while the semiconductor die 14 are part of the semiconductor wafer 10. A portion of the photoresist layer can be exposed and removed by an etching development process, and the conductive bumps 28 can be formed as copper pillars in the removed portion of the photoresist and over conductive layer 22 using a selective plating process. The photoresist layer can be removed leaving conductive bumps 28 that provide for subsequent mechanical and electrical interconnection and a standoff with respect to active surface 20. Conductive bumps 28 can include a height H1 in a range of 5-100 micrometers (μm) or a height in a range of 20-50 μm, or a height of about 25 μm.

FIG. 1B also shows the semiconductor wafer 10 can undergo an optional grinding operation with a grinder 29 to planarize the surface and reduce a thickness of the semiconductor wafer 10. A chemical etch can also be used to remove and planarize a portion of the semiconductor wafer 10.

Figure 1C:
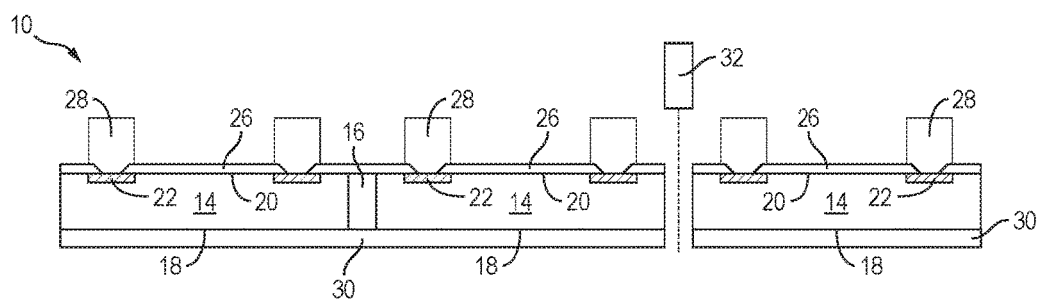

FIG. 1C shows attaching a die attach film (DAF) 30 to the semiconductor wafer 10 that can be disposed over, and in direct contact with, the backsides 18 of the semiconductor die 14. The DAF 30 can comprise epoxy, thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, epoxy resin with organic filler, silica filler, or polymer filler, acrylate based adhesive, epoxy-acrylate adhesive, a polyimide (PI) based adhesive, or other adhesive material.

FIG. 1C also shows semiconductor wafer 10 can be singulated through gaps or saw streets 16 using laser grooving, a saw blade or laser cutting tool 32, or both to singulate the semiconductor wafer 10 into individual semiconductor die 14 with conductive bumps 28. The semiconductor die 14 can then be used as part of a subsequently formed semiconductor component package as discussed in greater detail below with respect to FIGS. 2A-4B.

Figure 2A:
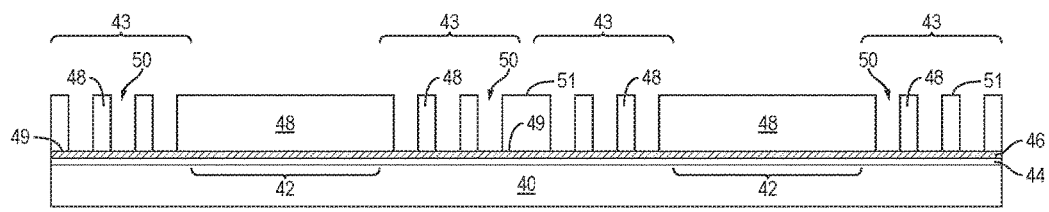
FIGS. 2A-2I illustrate the formation of fully molded peripheral PoP devices.

FIG. 2A shows providing a temporary carrier or temporary substrate 40, on which subsequent processing of the semiconductor devices, semiconductor component packages, or fully-molded peripheral PoP devices or packages 90 can occur, as described in greater detail herein. The temporary carrier 40 can contain base material such as metal, silicon, polymer, polymer composite, ceramic, glass, glass epoxy, stainless steel, or other suitable low-cost, rigid material or bulk semiconductor material for structural support. The temporary carrier can be circular, square, rectangular, or other suitable or desirable shape and can include any desirable size, such as a size equal to, similar to, or slightly larger or smaller than a reconstituted wafer or panel that is subsequently formed on or over the temporary carrier 40. In some instances, a diameter, length, or width of the temporary carrier can be equal to, or about, 200 millimeters (mm), 300 mm, or more.

The temporary carrier 40 can comprise a plurality of semiconductor die mounting sites or die attach areas 42 spaced or disposed across a surface of the temporary carrier 40, according to a design and configuration of the final semiconductor devices 90, to provide a peripheral area or space 43. The peripheral area 43 can partially or completely surround the die attach areas 42 to provide space for subsequent vertical, through package interconnections, and an area for fan-out routing or build-up interconnect structures.

An optional interface layer or double-sided tape 44 can be formed over carrier 40 as a temporary adhesive bonding film or etch-stop layer. The temporary carrier can be subsequently removed by strip etching, chemical etching, mechanical peel-off, CMP, plasma etching, thermal, light releasing process, mechanical grinding, thermal bake, laser scanning, UV light, or wet stripping. While the interface layer 44 is shown in FIG. 2A, for convenience and simplicity, the optional interface layer 44 has been omitted from subsequent FIGs. although a person of ordinary skill will understand that the interface layer 44 can remain and be present in processing shown in the other FIGs.

FIG. 2A also shows forming a seed layer 46 over the temporary carrier 40 and the interface layer 44, when present, so that the seed layer 46 can be in direct contact with the surface of the temporary carrier 40, or in direct contact with the interface layer 44, when present. The seed layer 46 can be one or more layers of Al, Cu, Sn, Ni, Au, Ag, or other suitable electrically conductive material. The formation, placement, or deposition of the seed layer 46 can be with PVD, CVD, electrolytic plating, electroless plating, or other suitable process. In some embodiments, the seed layer 46 can include Ti/Cu, TiW/Cu, or a coupling agent/Cu. The seed layer 46 can be deposited by sputtering, electroless plating, or by depositing laminated foil, such as Cu foil, combined with electroless plating.

FIG. 2A also shows forming or depositing a resist layer or photosensitive layer 48 over the temporary carrier 40. After formation of the resist layer 48 over the temporary carrier, the resist layer 48 can then be exposed and developed to form openings 50 in the resist layer 48. The openings 50 can be positioned over, or within a footprint of, the peripheral area 43 of the temporary carrier 40. The openings 50 can extend completely through the resist layer 48, such as from a first surface or bottom surface 49 of the resist layer 48 to second surface or top surface 51 of the resist layer 48 opposite the first surface 49. An after development inspection (ADI) of the developed resist layer 48 and the openings 50 can be performed to detect the condition or quality of the openings 50. After the ADI of resist layer 48 and openings 50, a descum operation can be performed on the developed resist layer 48.

Figure 2B:
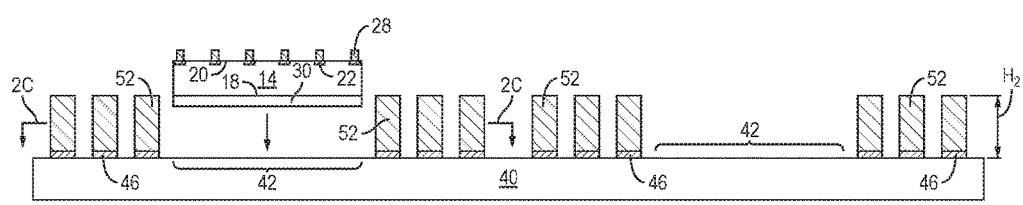

FIG. 2B shows the formation of a plurality of conductive interconnects 52 within the resist layer 48 that can be formed as columns, pillars, posts, bumps, or studs that are formed of copper or other suitable conductive material. Conductive interconnects 52 can be formed using patterning and metal deposition processes such as printing, PVD, CVD, sputtering, electrolytic plating, electroless plating, metal evaporation, metal sputtering, or other suitable metal deposition process. When conductive interconnects 52 are formed by plating, the seed layer 44 can be used as part of the plating process. Conductive interconnects 52 can be one or more layers of Al, Cu, Sn, Ni, Au, Ag, Pd, solder, or other suitable electrically conductive material and can include one or more layers. When forming the conductive interconnects 52 of multiple portions, such as vertically stacked portions of different conductive materials, the plating or formation of the conductive interconnects 52 can be part of multiple sequential processes. The formation of the conductive interconnects 52 comprising multiple vertically stacked portions of different materials is discussed in greater detail with respect to FIGS. 4A and 4B.

After formation of the conductive interconnects 52, the resist layer 48 can be removed, such as by a stripping process, leaving conductive interconnects 52 in the peripheral area 43 around the semiconductor die mounting sites 42 to provide for subsequent vertical or three dimensional (3D) electrical interconnection for the semiconductor devices 90. Conductive interconnects 52 can include a height H2 in a range of 100-300 μm or a height in a range of 150-250 μm, or a height of about 200 μm.

After removal of the resist layer 48, the semiconductor die mounting sites 42 on or over the temporary carrier 40 can be exposed and ready to receive the semiconductor die 14. The orientation of semiconductor die 14 can be either face up with active surface 20 oriented away from the temporary carrier 40 to which the semiconductor die 14 are mounted, or alternatively can be mounted face down with the active surface 20 oriented toward the temporary carrier 40 to which the semiconductor die 14 are mounted. After mounting the semiconductor die 14 to the temporary carrier 40 in a face up orientation, the DAF 30 can undergo a curing process to cure the DAF 30 and to lock the semiconductor die 14 in place over the temporary carrier 40.

Figure 2C:
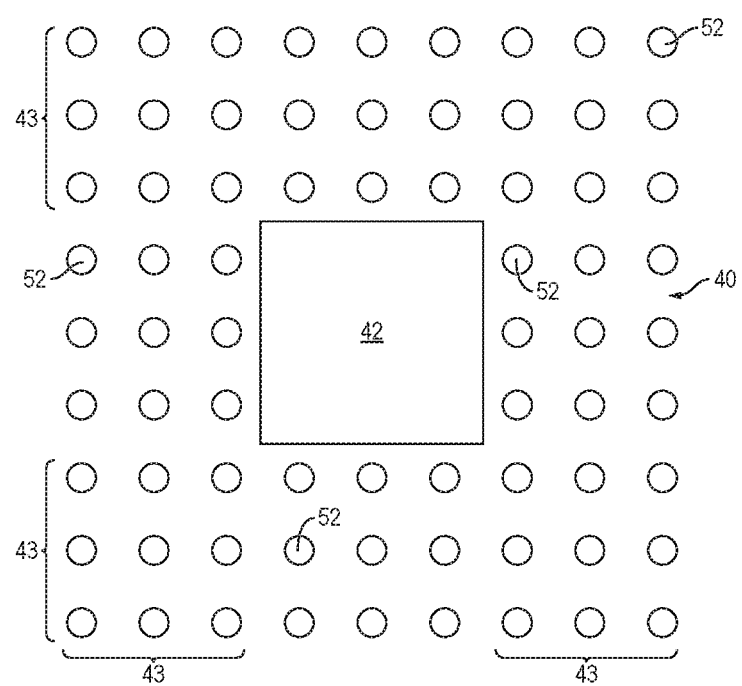

FIG. 2C shows a top or plan view of a portion of the temporary carrier 40 and the conductive interconnects 52 taken along the section line 2C from FIG. 2B. FIG. 2C shows that the conductive interconnects 52 can be formed within, and extend intermittently across, the peripheral area 43 and surround the semiconductor die mounting sites 42 without being formed within the semiconductor die mounting sites 42.

Figure 2D:
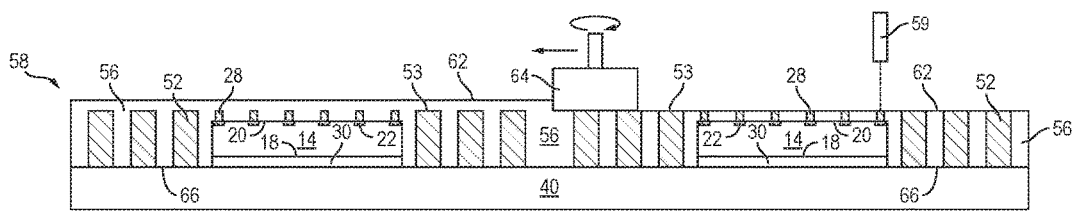

FIG. 2D shows that after mounting the semiconductor die 14 to the temporary carrier 40 a mold compound or encapsulant 56 can be deposited around the plurality of semiconductor die 14 using a paste printing, compression molding, transfer molding, liquid encapsulant molding, lamination, vacuum lamination, spin coating, or other suitable applicator. The mold compound 56 can be a polymer composite material, such as epoxy resin with filler, epoxy acrylate with filler, or polymer with proper filler. Semiconductor die 14 can be embedded together in mold compound 56, which can be non-conductive and environmentally protect the semiconductor die 14 from external elements and contaminants. The mold compound 56 can be formed adjacent to and directly contact all lateral sides of the semiconductor die (such as four sides), as well as be formed over the active surface 20 of the semiconductor die 14. The mold compound 56 can also be formed around and directly contact the sides of the conductive bumps 28 and the conductive interconnects 52 to form a reconstituted panel, reconstituted wafer, molded panel, or molded wafer 58.

The reconstituted panel 58 can optionally undergo a curing process or post mold cure (PMC) to cure the mold compound 56. In some instances, a top surface, front surface, or first surface 62 of the mold compound 56 can be substantially coplanar with first end 53 of the conductive interconnects 52. Alternatively, the top surface 62 of the mold compound 56 can be over, offset, or vertically separated from the first ends 53 of the conductive interconnects 52, such that the first ends 53 of the conductive interconnects 52 are exposed with respect to the encapsulant 56 after the reconstituted wafer 58 undergoes a grinding operation.

The reconstituted panel 58 can also undergo an optional grinding operation with grinder 64 to planarize the top surface, front surface, or first surface 68 of the reconstituted panel 58 and to reduce a thickness of the reconstituted panel 58, and to planarize the top surface 62 of the mold compound 56 and to planarize the top surface 68 of the reconstituted panel 58. The top surface 68 of the reconstituted panel 58 can comprise the top surface 62 of the mold compound 56, the first ends of the conductive interconnects 52, or both. A chemical etch can also be used to remove and planarize the mold compound 56 and the reconstituted panel 58. Thus, the top surface 68 of the conductive interconnects 52 can be exposed with respect to mold compound 56 in the peripheral area 43 to provide for electrical connection between semiconductor die 14 and a subsequently formed redistribution layer or build-up interconnect structure.

The reconstituted wafer 58 can also undergo a panel trim or trimming to remove excess mold compound 56 that has remained in undesirable locations as a result of a molding process, such as eliminating a flange present for a mold chase. The reconstituted panel 58 can include a footprint or form factor of any shape and size including a circular, rectangular, or square shape, the reconstituted wafer 58 comprising a diameter, length, or width of 200 millimeter (mm), 300 mm, or any other desirable size.

FIG. 2D also shows that actual positions of the semiconductor die 14 within the reconstituted panel 58 can be measured with an inspection device or optical inspection device 59. As such, subsequent processing of the fully molded panel 58 as shown and described with respect to subsequent FIGs. can be performed with respect to the actual positions of the semiconductor die 14 within the reconstituted panel 58.

Figure 2E:
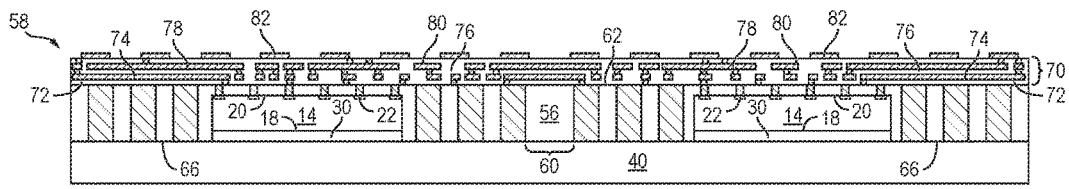

FIG. 2E shows forming a build-up interconnect structure 70 over the molded panel 58 to electrically connect, and provide routing between, conductive interconnects 52 and the conductive bumps 28. While the build-up interconnect structure 70 is shown comprising three conductive layers and three insulating layer, a person of ordinary skill in the art will appreciate that fewer layers or more layers can be used depending on the configuration and design of the semiconductor device 90. The build-up interconnect structure 70 can optionally comprise a first insulating or passivation layer 72 formed or disposed over the reconstituted panel 58. The first insulating layer 72 can comprise one or more layers of $SiO_2$, $Si_3N_4$, SiON, $Ta_2O_5$, $Al_2O_3$, or other material having similar insulating and structural properties. The insulating layer 72 can be formed using PVD, CVD, printing, spin coating, spray coating, sintering or thermal oxidation. Openings or first level conductive vias can be formed through the insulating layer 72 over the conductive interconnects 52 and the conductive bumps 28 to connect with the semiconductor die 14.

A first conductive layer 74 can be formed over the reconstituted panel 58 and over the first insulating layer 72 as a first RDL layer to extend through the openings in the first insulating layer 72, to electrically connect with the first level conductive vias, and to electrically connect with the conductive bumps 28 and the conductive interconnects 52. Conductive layer 74 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating or passivation layer 76, which can be similar or identical to the first insulating layer 72, can be disposed or formed over the reconstituted panel 58, the first conductive layer 74, and the first insulating layer 72. An opening or second level conductive via can be formed through the second insulating layer 76 to connect with the first conductive layer 74.

A second conductive layer 78, which can be similar or identical to the first conductive layer 74, can be formed as a second RDL layer over reconstituted panel 58, over the first insulating layer 72, over the first conductive layer 74, over the second level conductive via, or within an opening of the second insulating layer 72, to electrically connect with the first conductive layer 74, the first level and second level conductive vias, and the semiconductor die 14.

A third insulating or passivation layer 80, which can be similar or identical to the first insulating layer 72, can be disposed or formed over the second conductive layer 78 and the second insulating layer 76. An opening or a third level conductive via can also be formed in or through the third insulating layer 80 to connect with the second conductive layer 78.

A third conductive layer or UBMs 82 can be formed over the third insulating layer 80 and the third level conductive via to electrically connect with the other conductive layers and conductive vias within the build-up interconnects structure 70, as well as electrically connect to the semiconductor die 14, the conductive bumps 28, and the conductive interconnects 52. UBMs 82, like all of the layers, plating layers, or conductive layers formed by a plating process as presented herein, can be a multiple metal stack comprising one or more of an adhesion layer, barrier layer, seed layer, or wetting layer. The adhesion layer can comprise titanium (Ti), or titanium nitride (TiN), titanium tungsten (TiW), Al, or chromium (Cr). The barrier layer can be formed over the adhesion layer and can be made of Ni, NiV, platinum (Pt), palladium (Pd), TiW, or chromium copper (CrCu). In some instances the barrier layer can be a sputtered layer of TiW or Ti and can serve as both the adhesion layer and the barrier layer. In either event, the barrier layer can inhibit unwanted diffusion of material, like Cu. The seed layer can be Cu, Ni, NiV, Au, Al, or other suitable material. For example, the seed layer can be a sputtered layer of Cu comprising a thickness of about 2000 angstroms (e.g., 2000 plus or minus 0-600 angstrums). The seed layer can be formed over the barrier layer and can act as an intermediate conductive layer below subsequently formed bumps, balls, or interconnect structures 84. In some instances, the wetting layer can comprise a layer of Cu with a thickness in a range of about 5-11 μm or 7-9 μm. Bumps 84, such as when formed of SnAg solder, can consume some of the Cu UBM during reflow and forms an intermetallic compound at the interface between the solder bump 84 and the Cu of the wetting layer. However, the Cu of the wetting layer can be made thick enough to prevent full consumption of the Cu pad by the solder during high temperature aging.

In some instances, the UBMs 82 can comprise Ni, Pd and Au. UBMs 82 can provide a low resistive interconnect to build-up interconnect structure 70 as well as a barrier to solder diffusion and seed layer for solder wettability.

Figure 2F:
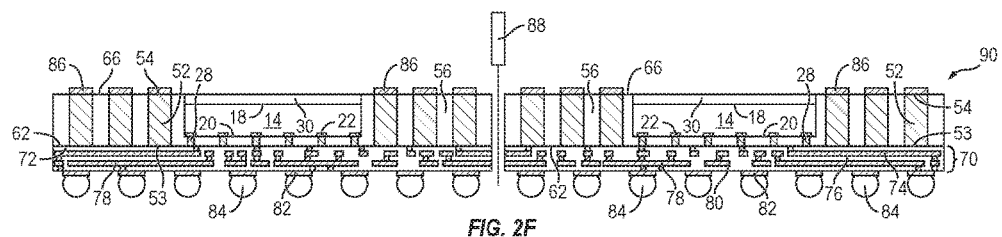

FIG. 2F shows removing the temporary carrier 40, to expose the second ends 54 of the conductive interconnects 52. The temporary carrier 40 can be removed, e.g., by grinding the temporary carrier 40, by exposing UV release tape 44 to UV radiation to separate the UV tape 44 from the glass substrate 40, or other suitable method. After removal of the temporary carrier 40, the reconstituted panel 58 can also undergo an etching process, such as a wet etch, to clean the surface of the reconstituted panel 58 exposed by removal of the temporary carrier 40, including the exposed second ends 54 of the conductive interconnects 52.

The exposed second ends 54 of the conductive interconnects 52 can also undergo a coating or pad finishing process, such as by an Organic Solderability Preservative (OSP) coating, solder printing, electroless plating, or other suitable process, to form a PoP UBM pad, UBM structures, or land pads 86. The UBMs 86 can comprise a multiple metal stack of one or more of an adhesion layer, barrier layer, seed layer, or wetting layer. The adhesion layer can comprise Ti, TiN, TiW, Al, or Cr. The barrier layer can be formed over the adhesion layer and can be made of Ni, NiV, Pt, Pd, TiW, or CrCu. The barrier layer can inhibit unwanted diffusion of material, like Cu. The seed layer can be Cu, Ni, NiV, Au, or Al. The seed layer can be formed over the conductive interconnects 52 and can act as an intermediate conductive layer below subsequently formed PoP bumps, balls, or interconnect structures. In some instances, the UBMs 86 can comprise Ni and Au. UBMs 86 can provide a low resistive interconnect as well as a barrier to solder diffusion and seed layer for solder wettability.

Opposite the UBMs 86, bumps, balls, or interconnect structures 84, can be formed on the UBM pad 82 and over the build-up interconnect structure 70. The bumps 84 can be formed by depositing an electrically conductive bump material over UBMs 82 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The bump material can be bonded to UBMs 82 using a suitable attachment or bonding process. In one embodiment, the bump material is reflowed by heating the material above its melting point to form spherical balls or bumps 84. In some applications, bumps 84 are reflowed a second time to improve electrical contact to UBMs 82. The bumps 84 can also be compression bonded or thermocompression bonded to the UBM layer 82. Bumps 84 represent one type of interconnect structure that can be formed over UBM 82. The interconnect structure can also use bond wires, conductive paste, stud bump, micro bump, or other electrical interconnects.

FIG. 2F also shows singulation of the molded panel 58 and build-up interconnect structure 70 with saw blade or laser cutting tool 88 to form individual semiconductor devices or packages 90.

Figure 2G:

FIG. 2G shows a cross-sectional profile view of a final semiconductor device 90 with peripheral conductive interconnect structures 52 disposed around, and laterally offset from, the semiconductor die 14 and within the encapsulant material 56. The peripheral conductive interconnect structures 52 can extend completely through the encapsulant 56 in a vertical direction from the top surface 62 of the encapsulant 56 to the bottom surface 66 of the encapsulant 56 opposite top surface 62 to provide vertical electrical interconnection through the semiconductor device 90, which can facilitate stacking of packages in package on package (PoP) arrangements.

Figure 2H:
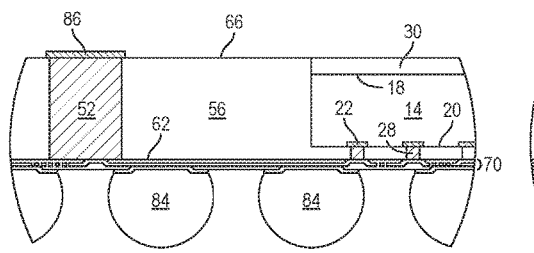
Figure 2I:
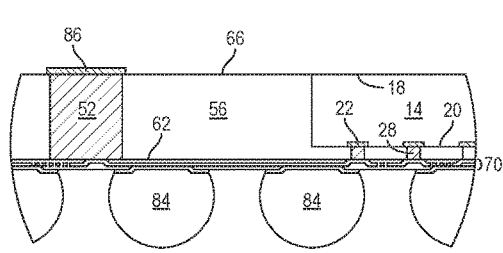

FIGS. 2H and 2I show close-up views of a portion of the cross-sectional profile view of the semiconductor device 90 shown in FIG. 2G, taken at the section line 2H-2I. FIG. 2H shows that the backside 18 of the die 14 can comprise the DAF 30 used to attach the die 14 face-up to the temporary carrier 40 during the encapsulation process with the mold compound 56, the DAF 30 becoming a part of a final structure of the semiconductor device 90. The DAF 30 can be exposed after removal of the temporary carrier 40, or with the removal of the temporary carrier 40. Keeping the DAF 30 as part of the semiconductor device 90 can balance a thermal expansion mismatch at both sides 18, 20 of the semiconductor die 14, thereby reducing warpage of the package 90.

On the other hand, FIG. 2I shows an arrangement in which the DAF 30 is not present as part of the final package 90, such that back side 18 of the semiconductor die 14 is exposed, such as after the carrier removal process, with respect to mold compound 56. By leaving the backside 18 of the semiconductor die 14 exposed with respect to mold compound 56 or a exterior of the package 90, thermal performance of the package 90 can be improved and a thickness of the package 90 can also be reduced. Optionally, a high thermal conductivity die attach material, thermal interface material (TIM), or heat sink can be coupled or attached to the backside 18 of semiconductor die 14 to improve thermal performance of the semiconductor die 14 and the package 90.

Figure 3:
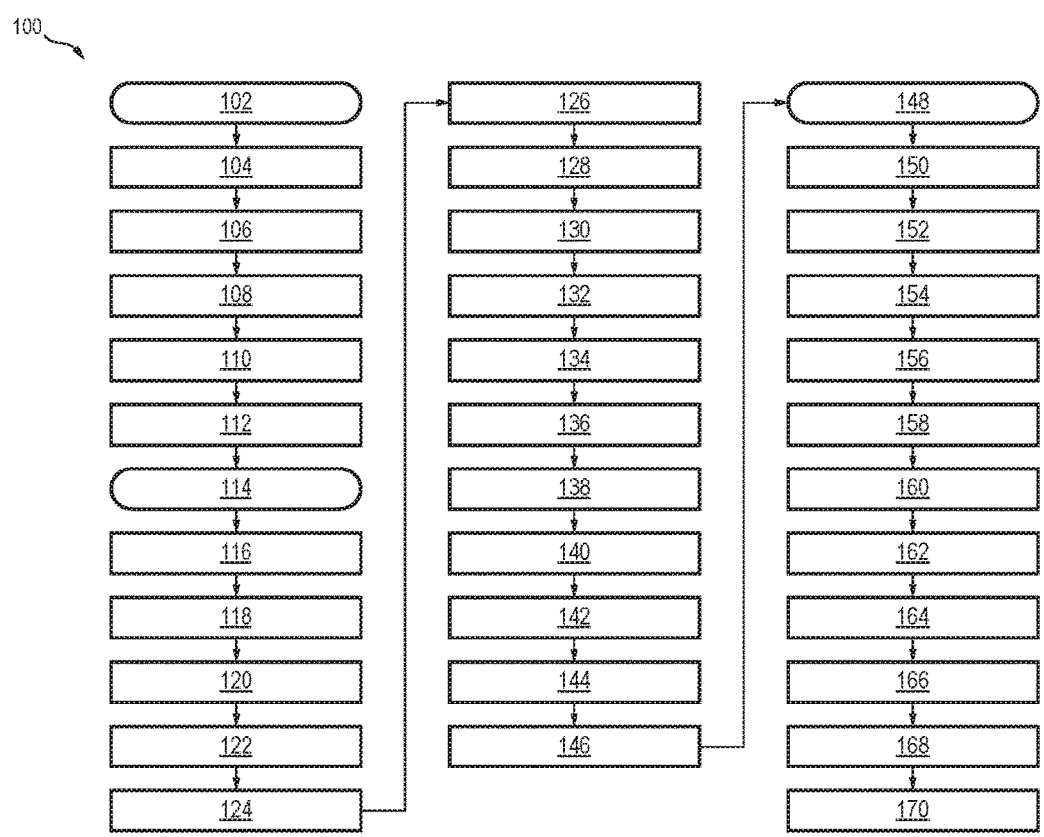
FIG. 3 is a flow chart illustrating an aspect of processing used in a method of forming fully-molded peripheral PoP devices.

FIG. 3 shows a flow chart 100 illustrating a non limiting-example of a method of forming fully-molded peripheral PoP devices or packages 90, as illustrated and described in FIGS. 1A-2H, 4A, and 4B. The elements, actions, or steps listed in FIG. 3 can be performed in the order or sequence shown, but need not be. Fewer elements as well as the order or sequence of the various elements included in forming the semiconductor device 90 can be modified without departing from the spirit and scope of the present disclosure.

By way of summary, elements 102-112 generally refer to processing on the semiconductor wafer 10 containing the semiconductor die 14, as shown in FIGS. 1A-1C, and can be processed at a same time, or in parallel with, the processing that occurs at elements 114-130. The temporary carrier of element 114 allows for mounting of the semiconductor die 14 from elements 102-112; and as such, elements 114-148 can refer to the processing of the semiconductor die until the reconstituted wafer or m-series panel 58 of FIG. 2D and element 24 is formed. The subsequent processing can occur at the reconstituted wafer level, as described at elements 25-35 and shown in FIGS. 2F-2H, when the semiconductor devices 90 are produced. Below, the processing at each of the elements shown in the flow chart 100 of FIG. 3 are presented below in greater detail.

Element 102 represents providing the semiconductor wafer 10, as shown in FIG. 1A. The subsequent processing presented in elements 102-112 can occur with respect to the semiconductor wafer 10 as shown in FIG. 1B. More specifically, element 104 represents forming the conductive interconnects 28 over the semiconductor die 14 and in contact with contact pads 22, while the semiconductor die 14 are part of the semiconductor wafer 10. Element 106 represents thinning the semiconductor wafer 10. Element 108 represents attaching the DAF 30 to the semiconductor wafer 10. Element 110 represents laser grooving the semiconductor wafer 10 at, or within, the saw streets 16. Element 112 represents dicing or saw cutting the semiconductor wafer 10 using saw blade or laser cutting tool 32.

Element 114 represents providing the temporary carrier 40, on which the subsequent processing represented by elements 8-23 or 8-31 can occur. Element 116 represents sputtering the seed layer 46 over the temporary carrier 40. Element 118 represents forming the resist layer 48 over the seed layer 46. Element 120 represents exposing the resist layer 48. Element 122 represents developing the exposed resist layer 48 to form openings 50 in the resist layer 48. Element 124 represents performing an after development inspection (ADI) on the developed resist layer 48 and the openings 50. Element 126 represents performing a descum operation on the developed resist layer 48. Element 128 represents forming or plating the conductive interconnects 52. Element 130 represents removing or stripping the resist layer 48. Element 132 represents mounting the semiconductor die 14 to the temporary carrier 40. Element 134 represents curing the DAF 30 to lock the semiconductor die 14 in place over the temporary carrier 40, within the die attach area 42. Element 136 represents molding or encapsulating the semiconductor die 14, the conductive bumps 2, and the conductive interconnects 52 with mold compound or encapsulant 56 to form a reconstituted panel 58. Element 138 represents a PMC of the mold compound 56. Element 140 represents grinding top surface 62 of the mold compound 56. Element 142 represents a wet etch of the reconstituted panel 58 after the grinding with grinder 64, after which first ends 53. Element 144 represents a panel trim or trimming of the reconstituted wafer 58 that can eliminate a flange present for a mold chase. Element 146 represents measuring an actual position of the semiconductor die 14 within the reconstituted panel 58. Element 148 represents having a fully molded panel 58 in which the actual position of the semiconductor die 24 within the fully molded panel 58 are known. The subsequent processing at elements 150-170 can occur with respect to the fully molded panel 58.

Elements 150-160 represent forming a build-up interconnect structure 70 over the molded panel 58. More specifically, element 150 represents optionally forming a first insulating or passivation layer 72 over the molded panel 58, and first level conductive vias through the insulating layer 72 to connect with the semiconductor die 14. Element 152 represents forming a first conductive layer 74 as a first RDL layer to electrically connect with the first level conductive vias to electrically connect with the conductive bumps 28 and the conductive interconnects 52. Element 154 represents a second insulating or passivation layer 76 disposed or formed over the first conductive layer 74 and the first insulating layer 72, as well as a second level conductive via formed through the second insulating layer 76 to connect with the first conductive layer 74. Element 156 represents forming a second conductive layer 78 as a second RDL layer over the first conductive layer 74 and the first insulating layer 72 to electrically connect with the first conductive layer 74 and the first level and second level conductive vias. Element 158 represents a third insulating or passivation layer 80 disposed or formed over the second conductive layer 78 and the second insulating layer 76, as well as a third level conductive via formed through the third insulating layer 80 to connect with the second conductive layer 78.

Element 160 represents forming a third conductive layer 32 as a UBM layer over the third insulating layer and the third level conductive via to electrically connect with the other conductive layers and conductive vias within the build-up interconnects structure 70 and the semiconductor die 14, such as through the conductive bumps 28, and the conductive interconnects 52.

Element 162 represents removing the temporary carrier 40 to expose the second ends 54 of the conductive interconnects 52. Element 164 represents the molded panel 58 undergoing an etching process to clean the exposed second ends 54 of the conductive interconnects 52. Element 166 represents the exposed second ends 54 of the conductive interconnects 52 undergoing a coating or pad finishing process, such as by electroless plating or other suitable process, to form a PoP UBM pad or UBM structure 86. PoP pad 86 can comprise one or more conductive layers, such as nickel and gold, and can occur at both the top and bottom surfaces of the copper posts exposed at the top and bottom of the package at a same time. Element 168 represents a package interconnect, such as a bump or solder ball 84, being formed on the UBM pad 82. Element 170 represents singulation of the molded panel 58 and build-up interconnect structure 70 with saw blade or laser cutting tool 88 to form individual semiconductor devices or packages 90.

Figure 4A:
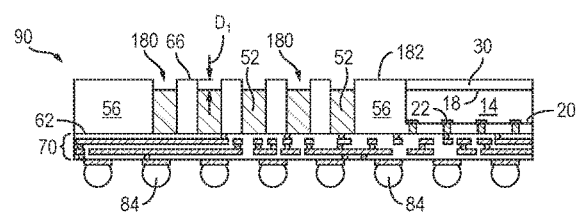
FIGS. 4A-4C illustrate an aspect of partially etched fully molded peripheral PoP devices.
Figure 4B:
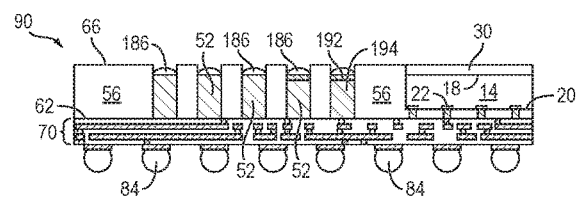
Figure 4C:
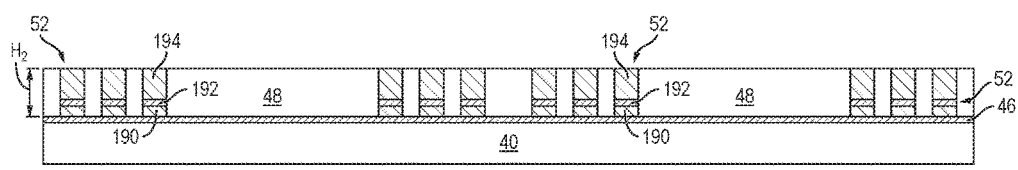

The process flow for FIGS. 4A-4C can continue from, and include the features or elements shown in and described with respect to, FIGS. 2A-2H and 3. Continuing from FIG. 2E or 3, FIG. 4A shows the reconstituted panel 58 and build-up interconnect structure 70 having undergone an additional process, step, or feature of removing the temporary carrier 40 and the optional interface layer 44, such as by grinding or UV release, to expose the conductive interconnects 52 (see, e.g., FIG. 2F and element 162 of FIG. 3) after the attachment or formation of bumps 84 (see, e.g., FIG. 2F and the ball attach at element 168 of FIG. 3).

FIG. 4A also shows the omission of the PoP UBM pads 86 from FIG. 2F with the additional feature of a plurality of recesses or etched recesses 180 disposed along a top surface, front surface, or first surface 182 of the package 90. In some instance, the top surface 182 of the semiconductor device 90 can be coplanar or coextensive with the top surface 62 of the mold compound 56, and can also be coplanar or coextensive with the top surface 68 of the reconstituted panel 58. The recesses 180 can be formed by etching or removing a portion of the conductive interconnects 52 to form an offset, gap, or distance 184 with a depth D. The depth D1 can extend from the top surface 182 of the conductive interconnects 52 to the top surface top surface 182 of the semiconductor device 90 or the top surface 62 of the mold compound 56. In some instances, the depth D can be in a range of, or about, 1-30 μm, or 1-20 μm, or 1-10 μm. The offset 184 allows the top surface 182 of the conductive interconnects 52 to be offset, recessed, or lowered with respect to the top surface 182 of the semiconductor device 90, which in turn can reduce a height of multiple packages or semiconductor devices, such as semiconductor devices 90, when mounted on top of one another in a PoP arrangement.

FIG. 4B, continuing from FIG. 4A, shows a solder bump, bump, ball, or interconnect 186 can be disposed within the recess 180 in the encapsulant 56 over the conductive interconnects 52. The solder bump 186 can be formed using a solder paste or cap, such as a tin silver (SnAg) paste or cap or other suitable material, that can be formed with a solder paste print or ball drop and reflow process to facilitate stacking of multiple packages in a PoP configuration. In other instances, the solder bump can be reflowed from an etch stop layer or material deposited during the formation of the conductive interconnect 52, as described in greater detail below with respect to FIG. 4C. In any event, and notwithstanding the method of formation, the solder bump 186, such as when formed as a SnAg cap, can be less expensive than the PoP UBM pad 86 formed with a NiAu finish, as discussed with respect to FIG. 2F. Inclusion of the cap 186 shown in FIG. 4B can improve a yield of semiconductor devices 90 and help reduce package failures resulting from package warping. Additionally, the mold compound 56 and the DAF 30 formed over the backside 18 of the semiconductor die 14 can also help improve performance of the semiconductor devices 90 during thermal cycling as well as reduce warpage of the semiconductor devices 90.

FIG. 4C, similar to FIGS. 2A and 2B, shows the conductive interconnects 52 can be formed comprising multiple portions or layers, including a first portion 190, an etch stop layer 192, and a second portion 194. The first portion 190 of conductive interconnect 52 can be formed over, and in direct contact with, the temporary carrier 40 or the optional interface layer 44 in the peripheral area 43 around the semiconductor die mounting site 42. After forming the first portion 190, an etch stop layer 192 can be formed by plating, or by another suitable process, over the first portion 190 of the conductive interconnect 52. After forming the etch stop layer 192, a second portion 194 of the conductive interconnect 52 can be formed over the etch stop layer 192 and over the first portion 190 of the conductive interconnect 52. In some instances, footprints of the first portion 190, the etch stop layer 192, and the second portion 194 can be equal or substantially equal with respect to each other, such as within a range of 0-10% of each other.

The first portion 190 and the second portion 194 of the conductive interconnect 52 can be formed of a same or similar material, such as copper, or any other suitable material as described above with respect to the conductive interconnect 52. In some instances, the etch stop layer 192 can be formed as a thin layer of material different from the material forming the first portion 190 and the second portion 194 of the conductive interconnects 52. The thin layer of etch stop material 192 can comprise a thickness of 1-80 μm, 5-65 μm, 15-50 μm, 20-40 μm, or thereabout, such as plus or minus 1-20 percent. The etch stop layer 192 can be formed of a metal such as Au, Ag, or solder. In some instances, the first portion 190 and the second portion 194 will be formed of materials that will be etched by, or respond to, a first etching chemistry, and the etch stop layer 192 will be formed of a material that will not respond to the first etching chemistry, or will respond to the first etching chemistry at a substantially reduced rate such as at a rate that is only 0-10%, 0-5%, or less than 2% of the rate of the first etching chemistry. Conversely, the etch stop layer 192 will respond to a second etching chemistry, while the first portion 190 and the second portion 194 will not respond, or respond at a substantially reduced rate to the second etching chemistry, such as 0-10%, 0-5%, or less than 2% of the rate of the second etching chemistry. For instance, the etch stop layer 192 can be formed of a material that is not etched by the first etching chemistry that etches copper; and the second portion 194 of the conductive interconnect 52 can be formed of a copper material that is not etched by the second etching chemistry that etches the etch stop layer 192.

Accordingly, instead of simply etching a plurality of conductive interconnects 52 without the etch stop layer 192 (as shown in FIG. 4A) and relying on uniformity of the etching process to produce etched interconnects 52 of uniform height, or recesses 180 of uniform depth D, the first portion of the conductive interconnects 52 can be over-etched. Over-etching as used herein can refer to exposing at least a part of the conductive interconnect 52 to the etch chemistry longer than required or normally required in order to achieve the desired etch depth. Over-etching the first portions 190 of the conductive interconnects 52 can ensure that all of the first portions 190 are completely, entirely, or substantially removed, while the etch stop layer 192 that is not etched by the first etching chemistry remains intact. As such, the heights of the etched interconnects 52 comprise uniform heights that comprise the heights of the second portions 194 and etch stop layers 192. Furthermore, the uniform heights of the etched interconnects 52 need not rely on the uniformity of etching rates, which in some instance can vary across the reconstituted panel 58. Instead, the uniformity of height of the etched conductive interconnects 52 and the uniformity of the depth D of recesses 180 depends on the uniformity of the formation of the first portion 190 and the etch stop layer 192, such as by plating, which can be more precise and uniform than the precision and uniformity of the etching process. Thus, over-etching can ensure a consistent etch depth, or depth D1 of recesses 180, and full removal of the desired amount of the first portion 190, even if there is variability in the removal of the first portion during etching with the first etching chemistry.

When the etch stop layer 192 is present, such as is shown in FIGS. 4B and 4C, treatment of the etch stop layer 192 can vary based on various aspects, designs, or embodiments of the semiconductor device 90. The inclusion of FIG. 4B with the illustration of the conductive interconnects 52 on the left of FIG. 4B without the etch stop layer 192 in the final semiconductor device 190, and the conductive interconnects 52 on the right of FIG. 4B with the etch stop layer 192 in the final semiconductor device 190, provides support for multiple arrangements of the conductive interconnects 52, which can be uniformly included in different semiconductor devices 90, and not necessarily with variation among different uses of the etch stop layer 192 within the same semiconductor device 90 as shown in FIG. 4B.

In some instances where the etch stop layer 192 is included as part of the conductive interconnect 52, the etch stop layer 192 can be formed as a solderable surface finish that remains over the second portion 194 of the conductive interconnect 52 when the conductive bump 186 is coupled to the conductive interconnect. Thus, the etch stop layer 192 can be positioned between, and be in direct contact with both of, the second portion 194 of the conductive interconnect 52 and the conductive bump 186, as shown in FIG. 4B.

In other instances where the etch stop layer 192 is included as part of the conductive interconnect 52, the etch stop layer 192 can be reflowed to form the conductive bump 186, or a portion of the conductive bump 186, after etching the first portion 190 of the conductive interconnect 52 to expose the etch stop layer 192. As such, the relative sizing or heights of the first portion 190, the etch stop layer 192, and the second portion 194 can vary according to desired configurations and designs of the final semiconductor device 90. In some instances, a top of the solder bump 186 can be substantially planar with, or at a same height as, the top surface 182 of the semiconductor device 90. In other instances, the top of the solder bump 186 can be at a different height than, or offset with respect to, the top surface 182 of the semiconductor device 90.

Depending of the final use or application of the etch stop layer 192, the vertical position or height of the etch stop layer 192 within the conductive interconnect 52 can vary. As the vertical position of the etch stop layer 192 varies within the conductive interconnect 52, the heights or relative heights of the first portion 190 and the second portion 194 can also vary within the conductive interconnects 52. In some instances, heights of the first portion 190 and the second portion 194 can be equal or substantially equal, so as to place the etch stop layer 132 at a midpoint or center of the conductive interconnects 52, as well as being spaced equidistantly from the top surface 68 of the reconstituted panel 58 and the bottom surface 69 of the reconstituted panel 58.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making a semiconductor device, comprising:
    providing a temporary carrier comprising a semiconductor die mounting site;
    forming a first portion of a conductive interconnect over the temporary carrier in a periphery of the semiconductor die mounting site;
    forming an etch stop layer over the first portion of the conductive interconnect;
    forming a second portion of the conductive interconnect over the etch stop layer and over the first portion of the conductive interconnect;
    mounting a semiconductor die at the semiconductor die mounting site;
    encapsulating the conductive interconnect and semiconductor die with a mold compound;
    exposing a first end of the conductive interconnect on the second portion of the conductive interconnect;
    forming a build-up interconnect structure to connect semiconductor die and the first ends of the conductive interconnect;
    removing the temporary carrier to expose a second end of the conductive interconnect on the second portion of the conductive interconnect opposite the first end of the conductive interconnect; and
    etching the first portion of the conductive interconnect to expose the etch stop layer.

2. The method of claim 1, wherein forming the etch stop layer comprises forming a layer of solder comprising a thickness in a range of 20-40 µm.

3. The method of claim 2, further comprising reflowing the solder etch stop layer to form a bump after etching the first portion of the conductive interconnect to expose the etch stop layer.

4. The method of claim 1, further comprising forming the etch stop layer as a solderable surface finish that remains over the second portion of the conductive interconnect when the second portion of the conductive interconnect is coupled to a conductive bump.

5. The method of claim 1, further comprising:
forming the etch stop layer of a material that is not etched by a first etching chemistry that etches the first portion of the conductive interconnect; and
forming the second portion of the conductive interconnect of a copper material that is not etched by a second etching chemistry that etches the etch stop layer.

6. The method of claim 1, further comprising forming a build-up interconnect structure to connect the semiconductor die and the first ends of the conductive interconnect.

7. The method of claim 1, further comprising:
exposing the first end of the conductive interconnect with a first grinding process; and
exposing the second end of the conductive interconnects with a second grinding process that removes the temporary carrier.

8. The method of claim 1, further comprising:
mounting the semiconductor die at the semiconductor die mounting site with a die attach film (DAF); and
exposing the DAF material after removing the temporary carrier.

9. A method of making a semiconductor device, comprising:
providing a temporary carrier comprising a semiconductor die mounting site;
forming conductive interconnects over the temporary carrier in a periphery of the semiconductor die mounting site;
mounting a semiconductor die at the semiconductor die mounting site;
encapsulating the conductive interconnects and semiconductor die with mold compound;
exposing first ends of the conductive interconnects;
removing the temporary carrier to expose second ends of the conductive interconnects opposite the first ends of the conductive interconnects; and
etching the conductive interconnects to recess the second ends of the conductive interconnects with respect to the mold compound.

10. The method of claim 9, wherein each of the conductive interconnects comprise:
a first portion;
a second portion; and
an etch stop layer disposed between the first portion and the second portion.

11. The method of claim 10, further comprising:
forming the etch stop layer of solder; and
reflowing the solder etch stop layer to form a bump after etching the first portion of the conductive interconnects to expose the etch stop layer of each conductive interconnect.

12. The method of claim 10, further comprising forming the etch stop layer as a surface finish that remains over the second portion of the conductive interconnects.

13. The method of claim 10, further comprising:
forming the etch stop layer of a material that is not etched by a first etching chemistry that etches the first portion of the conductive interconnects; and
forming the second portion of the conductive interconnects of a material that is not etched by a second etching chemistry that etches the etch stop layer.

14. The method of claim 9, further comprising forming a build-up interconnect structure to connect the semiconductor die and the conductive interconnects.

15. The method of claim 9, further comprising:
exposing the first end of the conductive interconnects with a first grinding process; and
exposing the second end of the conductive interconnects with a second grinding process that removes the temporary carrier.

16. A method of making a semiconductor device, comprising:
providing a temporary carrier comprising a semiconductor die mounting site;
forming conductive interconnects over the temporary carrier in a periphery of the semiconductor die mounting site, wherein the conductive interconnects further comprise:
a first portion,
a second portion, and
an etch stop layer disposed between the first portion and the second portion;
mounting a semiconductor die at the semiconductor die mounting site;
encapsulating the conductive interconnects and semiconductor die with mold compound;
exposing first ends of the conductive interconnects; and
removing the temporary carrier to expose second ends of the conductive interconnects opposite the first ends of the conductive interconnects.

17. The method of claim 16, further comprising:
forming the etch stop layer of solder; and
reflowing the solder etch stop layer to form a bump after etching the first portion of the conductive interconnects to expose the etch stop layer.

18. The method of claim 16, further comprising forming the etch stop layer as a surface finish that remains over the second portion of the conductive interconnects.

19. The method of claim 16, further comprising forming a build-up interconnect structure to connect the semiconductor die and the conductive interconnects.

20. The method of claim 16, further comprising:
exposing the first ends of the conductive interconnects with a first grinding process; and
exposing the second ends of the conductive interconnects with a second grinding process that removes the temporary carrier.

* * * * *